United States Patent
Sakaguchi

(10) Patent No.: US 6,441,386 B2
(45) Date of Patent: Aug. 27, 2002

(54) APPARATUS AND METHOD FOR MOUNTING ELECTRONIC COMPONENT

(75) Inventor: Hiroyuki Sakaguchi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 25 days.

(21) Appl. No.: 09/793,228

(22) Filed: Feb. 26, 2001

(30) Foreign Application Priority Data

Feb. 24, 2000 (JP) .......................... 2000-046917

(51) Int. Cl.$^7$ .............................................. G01N 21/86
(52) U.S. Cl. ............................. 250/559.29; 250/559.12
(58) Field of Search ....................... 250/559.29, 559.12, 250/221, 224; 414/937, 939, 940

(56) References Cited

U.S. PATENT DOCUMENTS 6,178,626 B1 * 1/2001 Hada et al. .................. 29/717

* cited by examiner

Primary Examiner—Que T. Le
(74) Attorney, Agent, or Firm—RatnerPrestia

(57) ABSTRACT

Apparatus and method for mounting electronic components enhanced in mounting efficiency by eliminating loss time are disclosed. In the apparatus and method, electronic components are picked up from a supplying unit of the electronic components by a transfer head, and are mounted on a board. The height of components already mounted on the board being conveyed is measured by a height measuring unit comprising a CCD light sensor including a light emitting unit and a light receiving unit. In mounting operation, the transfer height of the transfer head when moving on the board is set to a height enough to keep an allowance to the already mounted components on the basis of the height measurement of components. As a result, without useless elevating motions of the transfer head, the loss time is eliminated and the mounting efficiency is enhanced.

13 Claims, 4 Drawing Sheets

US 6,441,386 B2

APPARATUS AND METHOD FOR MOUNTING ELECTRONIC COMPONENT

FIELD OF THE INVENTION

The present invention relates to an apparatus for mounting electronic components on a board, and a method for mounting electronic components.

BACKGROUND OF THE INVENTION

In an apparatus for mounting electronic components on a board, electronic components stored in a supplying unit are picked up by a transfer head having nozzles for holding components by vacuum suction, and transferred onto the board, and mounted on specified mounting positions.

In this mounting operation, the transfer head moves on the board until reaching the specified mounting positions. On this moving path, electronic components may have been already mounted in a preceding process.

In such a case, the height of the transfer head must be set at the time of transfer so that electronic components held in the transfer head may not interfere with the existing electronic components.

In this case, regardless of the type of the board to mount on, generally, interference is prevented in mounting operation by elevating the transfer head to the highest transfer height of the mounting apparatus, so as not to cause an interference with the highest electronic components.

The height differs with the type of electronic components. When the board differs, the height of electronic components to be mounted is also different. If the transfer height of the transfer head in mounting operation is kept constant regardless of the type of the board, the transfer head is raised to an unnecessary height depending on the type of the electronic component to be mounted on the board. That is, the transfer head ascends and descends wastefully. Such unnecessary elevating motions are repeated in every mounting operation, and there is a loss time in the cycle time.

SUMMARY OF THE INVENTION

It is hence an object of the invention to present an apparatus and method for mounting electronic component capable of eliminating loss time and enhancing the mounting efficiency.

The apparatus for mounting electronic component of the invention, in order to pick up electronic components from a supplying unit of electronic components and mount them on a board, by a transfer head, comprises:

a) component height measuring means for measuring the height of components already mounted on the board before mounting operation by this apparatus for mounting electronic component, and b) transfer height control means for controlling the transfer height, when the transfer head moves on the board in mounting operation, on the basis of result of measurement by this component height measuring means.

The method for mounting electronic component of the invention, in order to pick up electronic components from a supplying unit, and mount them on a board, by a transfer head, comprises the steps of:

a) measuring the height of components already mounted on the board before mounting operation of electronic component, and b) controlling the transfer height, when the transfer head moves on the board in mounting operation, on the basis of result of measurement of component height.

According to the invention, the transfer height of the transfer head that picks up electronic components from a supplying unit and transfers them onto the board is determined on the basis of the height of components already mounted on the same board. Therefore, useless elevating motions of the transfer head are eliminated, the loss time is killed, and the mounting efficiency is enhanced.

DESCRIPTION OF THE PREFERRED EMBODIMENTS

A preferred embodiment of the invention is described while referring to the accompanying drawings.

Figure 1:
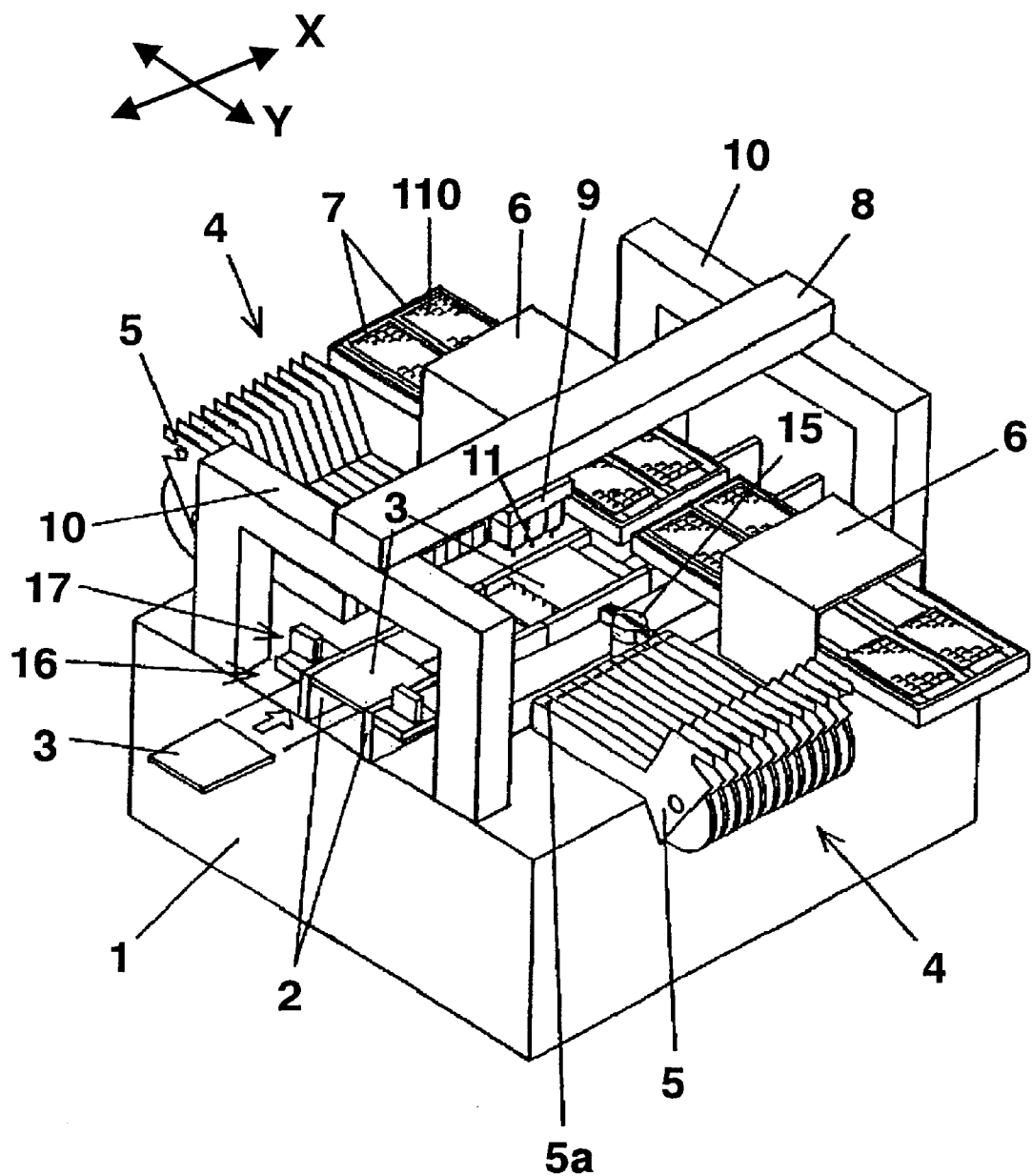
FIG. 1 is a perspective view of an apparatus for mounting electronic component in an embodiment of the invention.

Referring first to FIG. 1, a mounting apparatus of electronic components is explained. In FIG. 1, in the middle of a platform 1, a transfer route 2 is disposed in the X-direction. The transfer route 2 is a positioning unit for transferring and positioning a board 3. At both sides of the transfer route 2, supplying units 4 of electronic components are disposed. The supplying unit 4 includes a tape feeder 5 for feeding taped electronic components, and a tray feeder 6 for feeding electronic components contained in a tray 7.

A transfer head 9 of electronic components 110 is mounted on an X-axis table 8. The transfer head 9 is a multi-head type, and comprises plural nozzles 11. The X-axis table 8 is supported by a pair of parallel Y-axis tables 10. By driving the X-axis table 8 and Y-axis tables 10, the transfer head 9 moves horizontally. The nozzle 11 disposed at the lower end of the transfer head 9 picks up the electronic component 110 from the pickup position 5a of the tape feeder 5 and specified tray 7 of the tray feeder, and transfers the electronic component 110 onto the board 3 on the transfer route 2.

On the moving path of the transfer head 9 between the transfer route 2 and the supplying unit 4, a line camera 15 is disposed. The transfer head holding the electronic component moves horizontally above the line camera 15. At this time, the line camera 15 receives the light entering through the optical system by a one-dimensional line sensor, and recognizes the electronic component held on the transfer head.

At the upstream side (left side in FIG. 1) of the transfer route 2, there is a board receiving unit 16 for receiving the board 3 on which electronic components are already mounted partly from a previous process.

Figure 2:
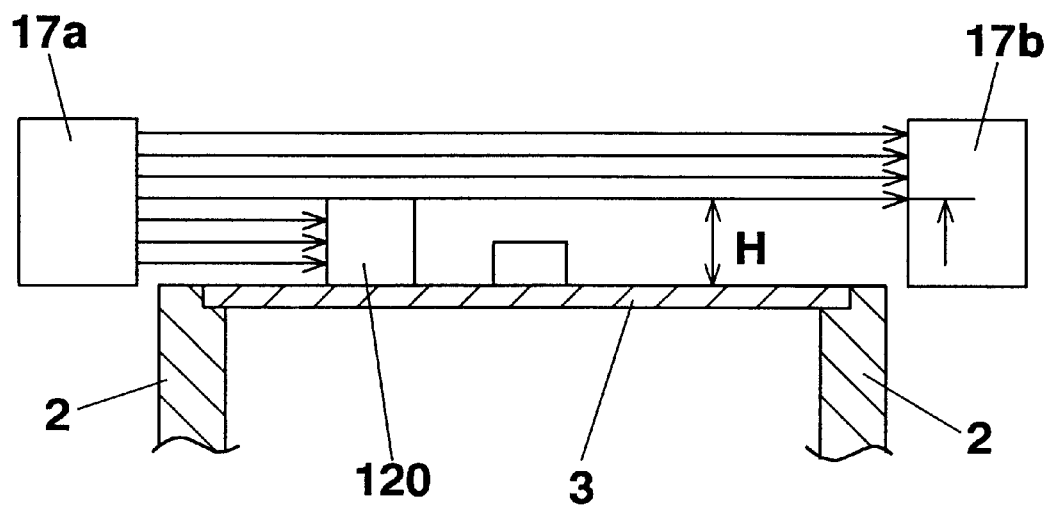
FIG. 2 shows a part of the apparatus for mounting electronic component in the embodiment of the invention.

As shown in FIG. 2, in the board receiving unit 16, there is a one-dimensional CCD light sensor 17 including a light emitting unit 17a and a light receiving unit 17b facing each other at both sides of the transfer route 2. When the partly packed board 3 is transferred on the transfer route 2, as shown in FIG. 2, in a state of the light being emitted from the light emitting unit 17a, the already mounted components on the board 3 cross the emitted light. Therefore, the range shielded by the already mounted component 120 and the range of the emitted light directly received in the light receiving unit 17b are distinguished and detected. Thus, by the shielded state of the light emitted from the light emitting unit 17a and received in the light receiving unit 17b, the data of height "H" of the already mounted component 110 to be measured is obtained. The data is sent to a height measuring unit (described below).

Figure 3:
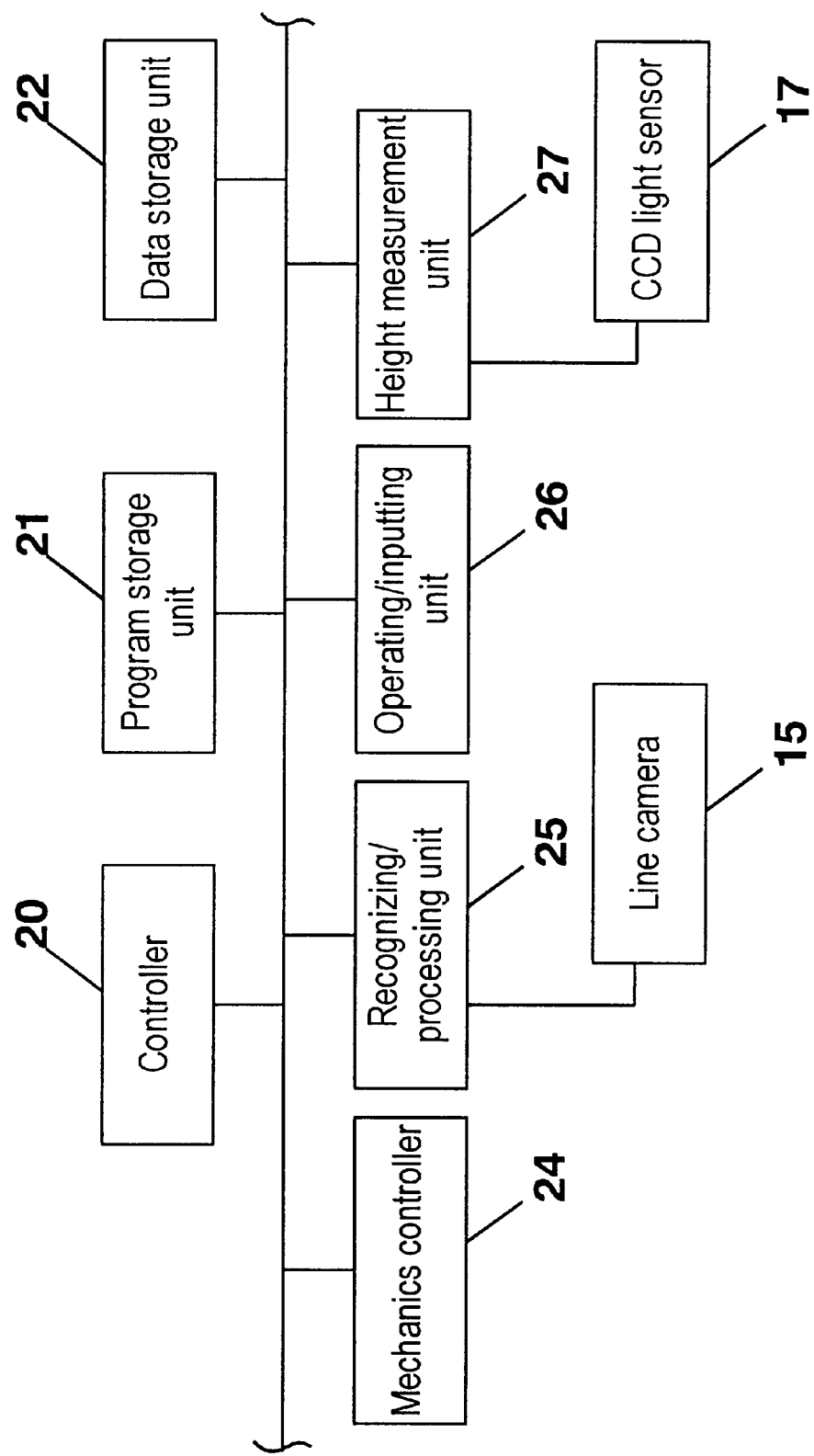
FIG. 3 is a block diagram showing a configuration of control system of the apparatus for mounting electronic component in the embodiment of the invention.

Referring now to FIG. 3, the configuration of the control system is explained. In FIG. 3, a controller 20 includes a CPU, and controls the operation of the entire apparatus for mounting electronic component. A program storage unit 21 stores necessary programs for various operations such as sequence program of mounting operation. The program includes an elevation height control program in the operation pattern when moving the transfer head. A data storage unit 22 stores various data such as mounting coordinates data and component data.

A mechanics controller 24 controls driving of motors for driving the XY table mechanism or transfer head 9. A recognizing/processing unit 25 processes image data of the electronic component 110 taken by the line camera 15, and identifies the component 110 and recognizes the position of the component 110. Then, the electronic component 110 is in a state held on the transfer head 9. An operating/inputting unit 26 includes operation buttons and keyboard provided in an operation panel, and enters component data such as tray height data, and operation commands.

A height measuring unit 27 measures the height of the already mounted component on the board 3 on the basis of the signal from the CCD light sensor 17. The CCD light sensor 17 and height measuring unit 27 are means for measuring the height of the existing components. The result of height measurement is sent to the controller 20, and the controller 20 controls the drive mechanism of the transfer head 9 on the basis of the sequence program and the height measurement result. Accordingly, in mounting operation, when the transfer head 9 moves on the packed board, the transfer head 9 moves at a transfer height corresponding to the height of the already mounted component on the packed board 3. Therefore, the controller 20 functions as transfer height control means for controlling the transfer height of the transfer head 9 on the basis of the height measurement result.

Figure 4:
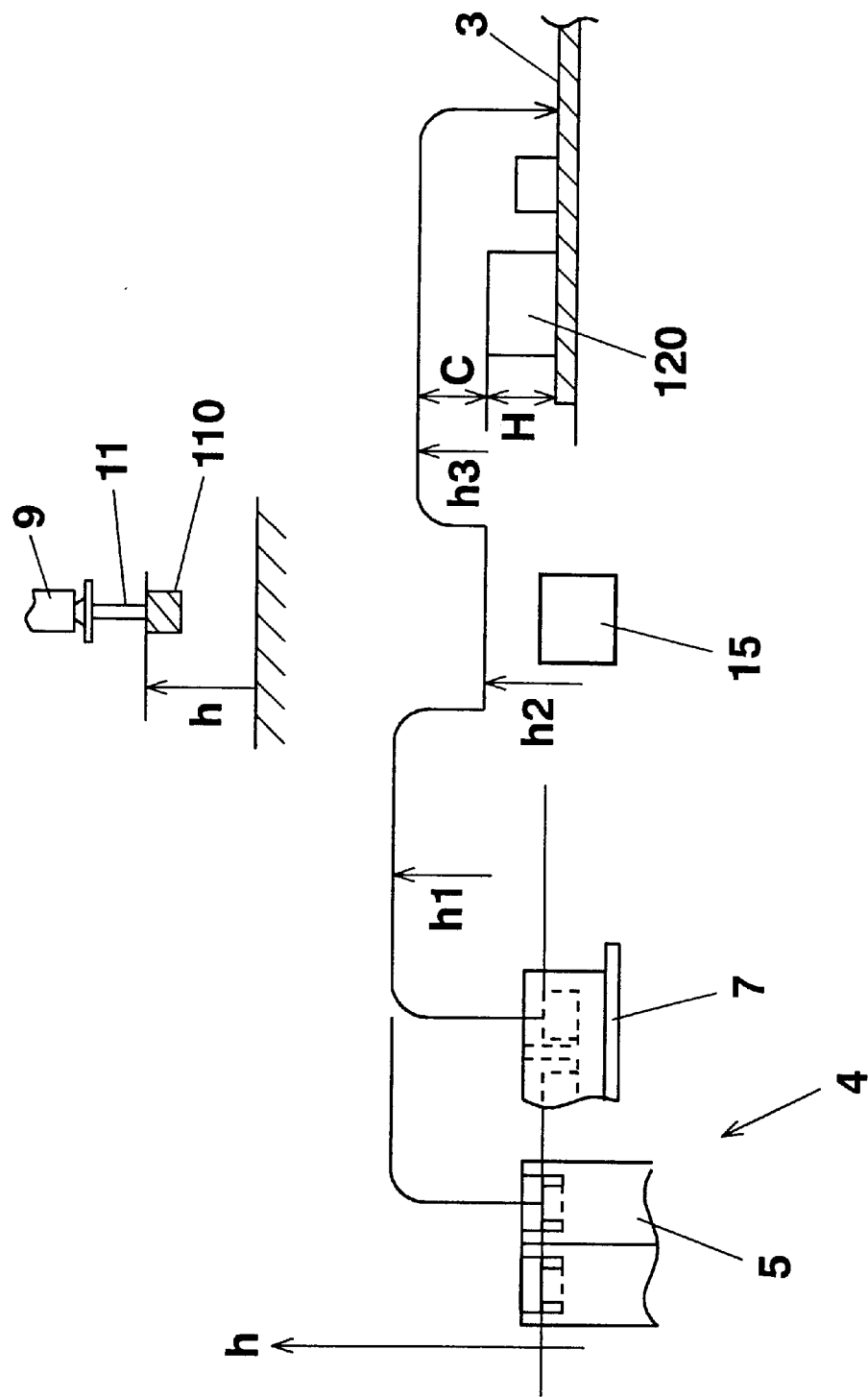
FIG. 4 shows a moving operation pattern of transfer head in electronic component mounting operation in an embodiment of the invention.

Referring now to FIG. 4, the operation pattern of the pickup operation by the transfer head 9 is explained.

This operation pattern is executed on the basis of i) operation program stored in the program storage unit 21, and ii) component data stored in the data storage unit 22.

FIG. 4 shows height changes during horizontal move of the transfer head 9, that is, changes of the height "h" at the lower end of the nozzle 11 mounted on the transfer head 9 in three actions of i) pickup of component from the tape feeder 5 or tray 7 of supplying unit 4, ii) recognition of component by line camera 15, iii) mounting components on board 3.

In FIG. 4, after picking up the electronic component 110 from the tape feeder 5 or tray 7, the transfer head 9 elevates to height "h1". This height "h1" is set at a height proper for the transfer head 9 to transfer the electronic component 110 stably, on the basis of the data including the height of the tray 7 in which the electronic component 110 has been stored and the height of the component. The height data are preliminarily stored in the data storage unit 22 as component data.

After elevating up to the transfer height "h1", the transfer head 9 moves to the line camera 15, and the height is changed herein to the specified recognition height "h2". This recognition height "h2" is the height determined by the imaging characteristic of the line camera 15.

After recognizing this height, the transfer head 9 changes its height to a different height "h3" until reaching the mounting point on the board 3. This height "h3" is determined by the height of the component 120 already mounted on the board 3 which has been determined by the height measuring unit 27. That is, the height is set so that a specified allowance "C" may be held between the lower surface of the electronic component P110 held on the transfer head 9 and the upper surface of the already mounted component 120.

The apparatus for mounting electronic component is thus composed. The method for mounting the electronic component 110 is explained below.

First, in the board receiving unit 16 of the transfer route 2, the board 3 for mounting on is supplied from the preceding process. When the board 3 moves on the transfer route 2, the height of the already mounted component 120 is measured by the CCD light sensor 17 and height measuring unit 27. On the basis of the result of measurement, the maximum height of the component 120 on the board 3 is determined. This maximum height data is transmitted to the controller 20.

Thus, the CCD light sensor 17 and height measuring unit 27 determine the height of components already mounted on the board 3.

Next, the transfer head 9 picks up the electronic component 110 from the tray 7 of the supplying unit 4. At this time, after sucking up the electronic component 110, the transfer head 9 elevates to transfer height "h1", that is, to a safe height not causing interference between the bottom of the electronic component 110 held on the nozzle and the upper edge of the tray. While keeping this transfer height, it moves onto the line camera 15, and descends to recognition height "h2". Keeping this recognition height "h2" during image taking, it moves onto the board 3, and mounts the held electronic component 110 on the mounting position.

At this time, the controller 20 controls the mechanics controller 24 on the basis of the maximum height data of the already mounted components 120. As a result, when the electronic component 110 held on the transfer head 9 moves above the already mounted component 120, a specified allowance "C" is always kept, so that the transfer head 9 moves at a proper height without ascending or descending wastefully. Therefore, useless elevating motions in the mounting operation is eliminated, the loss time is killed, and the mounting cycle time is shortened.

Such operation is executed every time the component held on the transfer head 9 moves above the already mounted components.

Alternatively, by storing the height and width of already mounted components in the data storage unit 22 as component data, the allowance "C" may be held on the basis of the height of each already mounted component.

Yet alternatively, the transfer head 9 may be moved by keeping the specified allowance "C" on the basis of the highest component of the already mounted components.

In this embodiment, the height measuring means is realized by a transmission type CCD light sensor 17 composed of light emitting unit 17a and light receiving unit 17b, but in other method, for example, a laser displacement meter may be used as distance measuring means for measuring the height at each point on the plane of the board as an optical distance from the laser displacement meter.

By using such height measuring means, the height of the electronic components mounted on the board may be measured in relation to the position on the plane of the board.

That is, the CCD light sensor can measure the height in relation to the position in the X-axis direction. Further, the distance measuring instrument for measuring the height at each point on the plane of the board as an optical distance from itself, such as the laser displacement meter, can measure the height at the position on the X-axis and Y-axis.

Therefore, the instrument such as the laser displacement meter is capable of measuring more finely as compared with the component height measurement by using transmission type light sensor which is capable of measuring the height only in a linearly scanning mode.

For example, in height measurement in linearly scanning mode, the height of a component existing only in part is detected as the height representing the scanning width to which the component belongs. Therefore, when the moving path of the transfer head 9 crosses the scanning width, transfer height "h3" is set on the basis of the representative height. Accordingly, a component presenting the representative height may not be always present in the actual moving path. It may hence cause useless elevating motions of the transfer head 9.

By contrast, in the case of the height measurement in relation to the position on the plane of the board, the height of components positioned in the moving path is individually determined. Therefore, when setting the transfer height of the transfer head when moving on the board, the height is set on the basis of the height of the components actually existing in the moving path. Therefore, useless actions are eliminated more thoroughly.

Suppose a plurality of apparatuses for mounting electronic components are coupled in series to compose one electronic component mounting line.

In this case, data of each mounting stage, that is, various data including height of electronic components to be mounted in the mounting operation in each apparatus for mounting electronic components and components mounted already in the mounting stage, are already known by mounting data.

Therefore, in mounting operation at each apparatus for mounting electronic components, the transfer height of the transfer head when moving on the board is set on the basis of the data of height of components already mounted in the previous stage. Thus, height measurement of components on the board in the embodiment is not required on every occasion in each mounting stage, so that the cycle time can be also shortened.

According to the invention, the transfer height of the transfer head when picking up the electronic component from the supplying unit and transferring onto the board is determined on the basis of the height of the components already mounted on the board. Therefore, eliminating unnecessary elevating motions of the transfer head, loss time is killed, and the mounting efficiency is enhanced.

What is claimed is:

1. An apparatus for mounting electronic component for picking up an electronic component from a supplying unit of an electronic component and mounting the electronic component on a board, by a transfer head, comprising:

component height measuring means for measuring a height of a component already mounted on said board, and transfer height control means for controlling a transfer height when said transfer head moves on the board on the basis of a result of measurement by said component height measuring means.

2. The apparatus for mounting electronic component of claim 1, wherein said component height measuring means comprises a light sensor including a light emitting unit and a light receiving unit, and the light sensor measures a height of a component to be measured depending on light emitted from the light emitting unit and received in the light receiving unit.

3. The apparatus for mounting electronic component of claim 1, wherein said component height measuring means includes distance measuring means for measuring a height at each point on said board as an optical distance.

4. The apparatus for mounting electronic component of claim 1, wherein said component height measuring means measures the height of the electronic component already mounted on said board in relation to a position on said board.

5. A method for mounting electronic component for picking up an electronic component from a supplying unit of the electronic component and mounting the electronic component on a board, by a transfer head, comprising the steps of:

(a) measuring a height of a component already mounted on said board, and b) controlling a transfer height when said transfer head moves on said board on the basis of result of measurement of the height at said step (a).

6. The method for mounting electronic component of claim 5, wherein at said step (a), when said board having the component already mounted moves on a transfer route, a light sensor including a light emitting unit and a light receiving unit emits light from the light emitting unit, and the light sensor detects a light shielding range by the component already mounted, and measures a height of the component already mounted.

7. The method for mounting electronic component of claim 5, wherein at said step (a), the height of each of the component already mounted on said board is measured as an optical distance, and the height of the component already mounted is determined.

8. The method for mounting electronic component of claim 5, wherein at said step (a), the height of the component already mounted on said board is measured in relation to a position on the board.

9. A method for mounting electronic component employing a plurality of apparatuses for mounting electronic component, each one of said plurality of apparatuses for mounting electronic component picking up an electronic component from a supplying unit of the electronic component and mounting the electronic component on a board by a transfer head, wherein a transfer height when said transfer head moves on said board is controlled on the basis of:

height data of i) a component to be mounted in said each apparatus, and ii) a component already mounted before mounting operation in said each apparatus.

10. The apparatus for mounting electronic component of claim 1, wherein said transfer height control means i) determines a height corresponding to a height of a component to be mounted as a first transfer height, and ii) if the component already mounted is present in a moving path of said transfer head, determines a second transfer height so that said transfer head may move above the component already mounted, while keeping a predetermined clearance between the component already mounted and the component to be mounted, on the basis of the height of the component already mounted and the height of the component to be mounted, and said transfer head mounts the component to be mounted on a specified point on said board after keeping at least one of the first and second transfer heights.

11. The method for mounting electronic component of claim 5, wherein said step (b)

i) determining a height corresponding to a height of a component to be mounted as a first transfer height, and ii) if the component already mounted is present in a moving path of said transfer head, including a step of determining a second transfer height so that said transfer head may move above the component already mounted, while keeping a predetermined clearance between the component already mounted and the component to be mounted, on the basis of the height of the component already mounted and the height of the component to be mounted, and the component to be mounted is mounted on a specified point on said board after keeping at least one of the first and second transfer heights.

12. The apparatus for mounting electronic component of claim 3, wherein said component height measuring means measures the height of the electronic component already mounted on said board in relation to a position on said board.

13. The method for mounting electronic component of claim 7, wherein at said step (a), the height of the component already mounted on said board is measured in relation to a position on the board.

* * * * *